United States Patent [19]
Tiller et al.

[11] Patent Number: 6,052,026
[45] Date of Patent: Apr. 18, 2000

[54] LINEAR GAIN CONTROLLED AMPLIFIER

[75] Inventors: Samuel Alfred Tiller, Ottawa; John J. Nisbet, Nepean, both of Canada

[73] Assignee: Nortel Networks Corporation, Montreal, Canada

[21] Appl. No.: 08/986,784

[22] Filed: Dec. 8, 1997

[51] Int. Cl.[7] ..................................................... H03F 3/45
[52] U.S. Cl. ........................................... 330/254; 330/260
[58] Field of Search .................................. 330/254, 259, 330/260, 294, 85

[56] References Cited

U.S. PATENT DOCUMENTS

| | | | |
|---|---|---|---|
| 4,227,095 | 10/1980 | Bazil | 330/85 |
| 4,462,002 | 7/1984 | Schade, Jr. | 330/259 |
| 4,471,311 | 9/1984 | Hirata | 330/254 |
| 4,517,525 | 5/1985 | Dijkmans et al. | 330/260 |
| 4,701,720 | 10/1987 | Monticelli | 330/260 |
| 5,635,874 | 6/1997 | Perrot | 330/259 |

*Primary Examiner*—Robert Pascal
*Assistant Examiner*—Khanh V. Nguyen

[57] ABSTRACT

A linear gain controlled amplifier comprising a differential transistor pair having an input and an output. The input is connected to a current supply which includes both AC and DC components. A voltage is derived which is proportional to the DC current component and this is compared with a control signal to produce an error signal which is supplied to the gain control terminals of the differential transistor pair. Traditionally, gain control has been implemented using a closed loop consisting of a power detector, a loop filter and a gain control element. The output of the power detector is compared with a reference voltage in a comparator, the output of which is filtered by the loop filter and applied to a control input of the gain control element. Most power detectors are either inaccurate or expensive and elaborate and may exhibit a control error of several decibels. The gain control elements themselves typically have non-linear control characteristics and suffer from poor repeatability and temperature variations which can necessitate extensive calibration. The present invention substantially avoids the foregoing problems by avoiding use of the prior art power detector and gain control element.

15 Claims, 8 Drawing Sheets

LINEAR GAIN CONTROLLED AMPLIFIER

BACKGROUND OF THE INVENTION

This invention relates to a linear gain controlled amplifier.

In most communications systems, and particularly in wireless networks, the communication channels are subject to variable propagation losses. Thus there is often a need at the receiver and/or transmitter for some form of gain control to maintain the signal level.

The required accuracy and stability of the gain control elements vary depending on the system and its implementation. There is a general requirement, however, that the gain control be as accurate as possible to enhance system performance by reducing the effects of interference, improving battery life, etc.

Traditionally, transceivers use some form of closed loop to maintain the signal levels. The loop consists of a power detector, a loop filter, and a gain control element. The output of the power detector is compared with a reference voltage in a comparator, the output of which is filtered by the loop filter (low-pass filter) and applied to a control input of the gain control element. Unfortunately, most power detectors are either inaccurate or expensive and elaborate and may exhibit a control error of several decibels. The gain control elements themselves typically have non-linear control characteristics and suffer from poor repeatability and temperature variations which can necessitate extensive calibration.

SUMMARY OF THE INVENTION

The present invention utilizes a property of differential pair transistors to substantially mitigate the above problems and create a gain controlled amplifier with superior characteristics. The invention takes advantage of the fact that both AC and DC current ratioing in a differential pair can be described by the same equation. Thus measuring or detecting the relative DC current gives a very accurate measure of the relative AC current. The relative AC current defines the gain of the amplifier stage. This DC measurement can be used in a high gain feedback loop to allow gain setting to a very high degree of accuracy.

Because the invention utilizes current steering in a differential pair, it exhibits very good signal linearity. Also, since it requires only one stack or layer of transistors, it is well suited to low voltage operation or to cascoding on existing circuitry.

According to a broad aspect of the invention, there is provided a linear gain controlled amplifier comprising a differential transistor pair having an input and an output, said input being connected to a current supply including DC and AC components, means connected to said differential transistor pair for producing a voltage proportional to said DC component, and comprising means for comparing said DC component with a control signal to produce an error signal, said error signal being supplied to gain control terminal means of said differential pair.

According to another broad aspect of the invention, there is provided a method of linear gain control of a differential amplifier powered by a current supply having DC and AC components, comprising generating a voltage proportional to said DC component, comparing said voltage with a control voltage to produce an error signal, and applying said error signal to said amplifier to control its gain.

According to yet another broad aspect of the invention, there is provided a linear gain controlled differential amplifier powered by a current supply having AC and DC components, comprising means for generating a DC voltage proportional to said DC component, means for comparing said DC voltage with a control voltage to produce an error signal, and means for applying said error signal to said amplifier to control its gain.

BRIEF DESCRIPTION OF THE DRAWINGS

Preferred embodiments of this invention will now be described with reference to the attached drawings in which.

DESCRIPTION OF THE PREFERRED EMBODIMENTS

Figure 1:
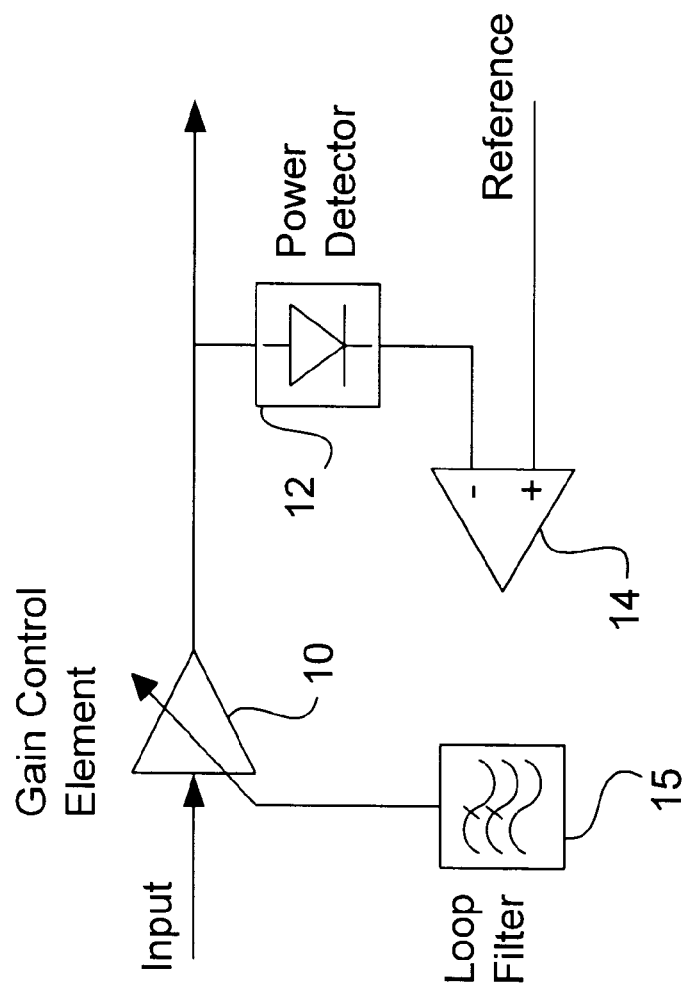
FIG. 1 is a block diagram of a prior art gain control circuit.

FIG. 1 illustrates a prior art gain control circuit comprising a gain control element 10, a power detector 12, a comparator 14 and a loop filter 15. The output of gain control element 10 is detected by power detector 12 and fed to one input of comparator 14 which compares it to a reference signal on its other input and outputs a difference (error) signal which is fed to a control terminal of gain control element 10 via low pass loop filter 15. Problems with this type of prior art arrangement have been mentioned above.

Figure 2:
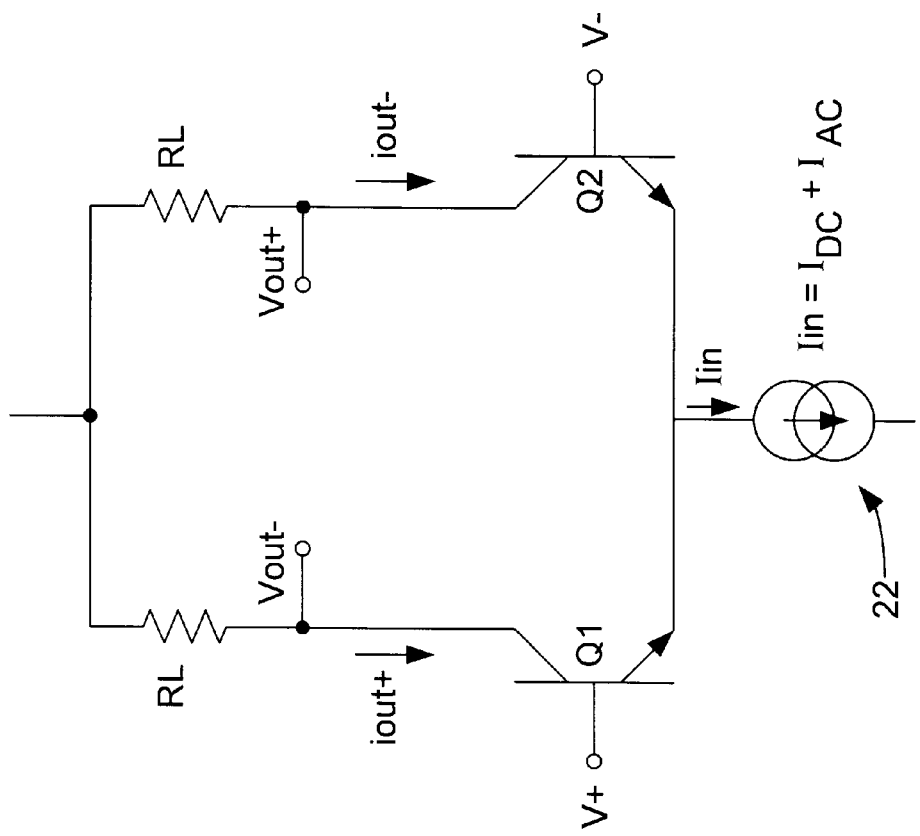
FIG. 2 is a circuit diagram of a differential transistor pair.

The present invention is an implementation of a gain controlled amplifier with linear gain control. It is based on a differential transistor pair as shown in FIG. 2 where it is generally designated 20. It comprises first and second transistors Q1, Q2, each having a collector connected to a respective load resistor RL, their emitters being connected to each other and to a current source 22 which includes DC and AC components, and their bases being connected to voltages V+ and V−, respectively.

The operation of the differential pair has been described in numerous publications, e.g., Analysis and Design of Analog Integrated Circuits, Second Edition, P. R. Gray, R. G. Meyer, John Wiley and Sons, 1984. The expression of greatest interest describes the current ratioing with respect to the differential base voltage.

$$i_{out} = i_{in} \tanh \frac{V_D}{2V_T}$$

where $V_T = KT/q$, the "thermal voltage"

$V_D = (V^+ - V^-)$, differential input voltage $i_{out} = (i_{out}^+ - i_{out}^-)$ differential output current Regarding the equation for $V_T$, K is Boltzmann's constant ($1.38 \times 10^{-23}$ joules/kelvin), T=absolute temperature in kelvins (273+temperature in ° C.) and q=the magnitude of electric charge ($1.602 \times 10^{-19}$ coulomb).

If the circuit is expanded to include load resistors, the transimpedance gain of the circuit can be defined as:

$$V_{out} = V_{max} \tanh \frac{V_D}{2V_T}$$

where $V_{max} = i_{in} * R_L$

Since the current, $i_{in}$, has both AC and DC components, the above equation could be rewritten to show both the AC and DC gain of the circuit. Since they are the same, this is not necessary. What this implies, however, is that if the DC gain can be controlled the AC gain can also be controlled. Also, a DC signal is available which is proportional to the AC gain.

Figure 3:
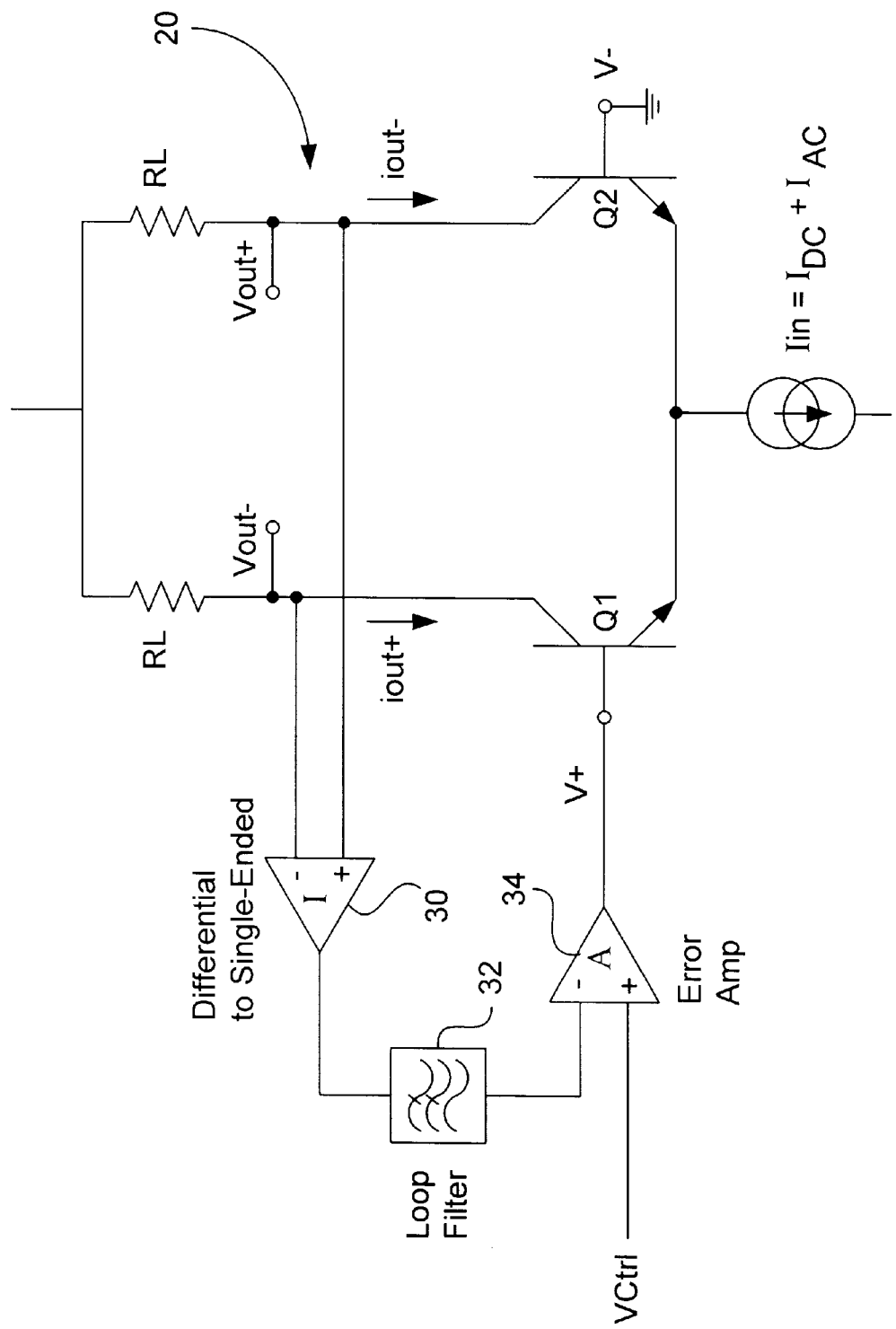
FIG. 3 is a circuit diagram of a first embodiment of the invention comprising a differential transistor pair with a DC signal feedback loop.

There are many ways to use this DC signal in a feedback loop, one of the simplest being shown in FIG. 3. In FIG. 3, the output of differential pair 20, i.e. $V_{out}$, is converted from a differential signal to a single-ended signal by amplifier 30. The low-pass loop filter 32 isolates the DC portion of the signal from amplifier 30 and feeds it to one input of an error amplifier 34. The other input of error amplifier 34 receives a control signal, $V_{ctrl}$. The output of error amplifier 34 is fed to the base of transistor Q1, the base of transistor Q2 being grounded. The relative currents through transistor Q1 and Q2 are adjusted by the error signal from error amplifier 34 to minimize the error signal. The accuracy with which the output DC tracks the control signal depends on the error amplifier gain and offset. Even the offset can be ignored in some applications where relative gain is of interest since the offset is essentially constant.

Referring to FIG. 3, the DC output of the closed loop system can be given by:

$$V_o = V_{max} \tanh\left[A \frac{(V_{ctrl} - V_o)}{2V_T}\right]$$

From inspection, it can be seen that as A becomes larger, the difference or error between $V_{ctrl}$ and $V_O$ becomes smaller. In the limit where A→ infinity, the error goes to zero. Therefore, the output DC tracks the input control voltage up to $V_{max}$. The AC signal will also linearly track the control voltage with maximum gain at $V_{ctrl}=V_{max}$ and minimum gain at $V_{ctrl}=0$.

Note that if $V_{ctrl}$ becomes negative, the output is phase shifted by 180 degrees. The maximum negative gain is at $-V_{max}$.

The differential to single-ended converter shown in FIG. 3 is not strictly required. The DC can be differentially low-pass filtered and differentially fed to the bases of the differential pair after summing with a differential reference signal in differential error amplifiers. An embodiment of this variation is illustrated in FIG. 7.

Figure 7:
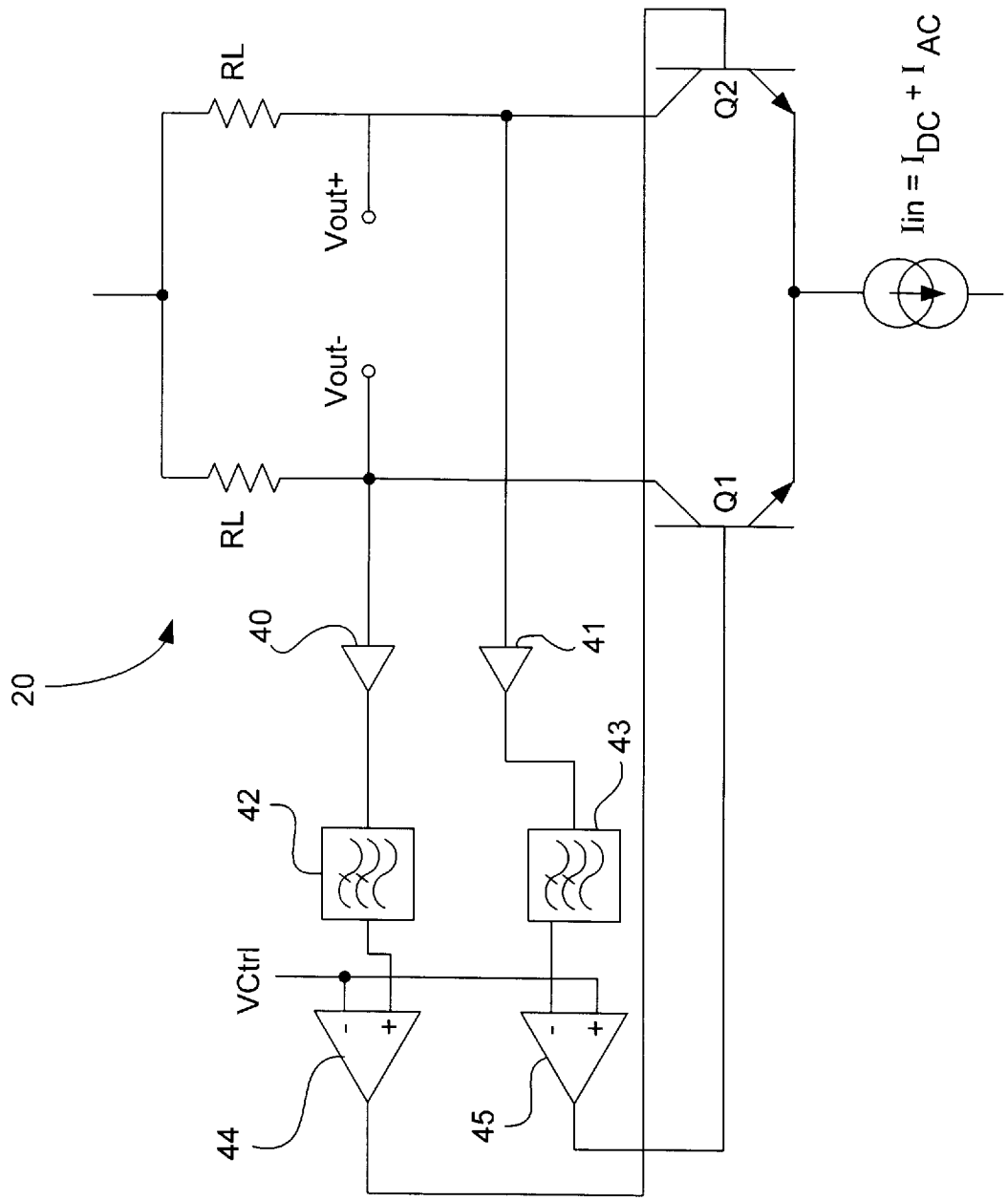
FIG. 7 is a circuit diagram of a fourth embodiment of the invention.

Referring to FIG. 7, the differential output of amplifier 20 is coupled by amplifiers 40, 41 to low-pass filters 42, 43 to produce + and − DC components which are compared with $V_{ctrl}$ in error amplifiers 44, 45, the outputs of which are fed to the bases of transistors Q1 and Q2.

Figure 4:
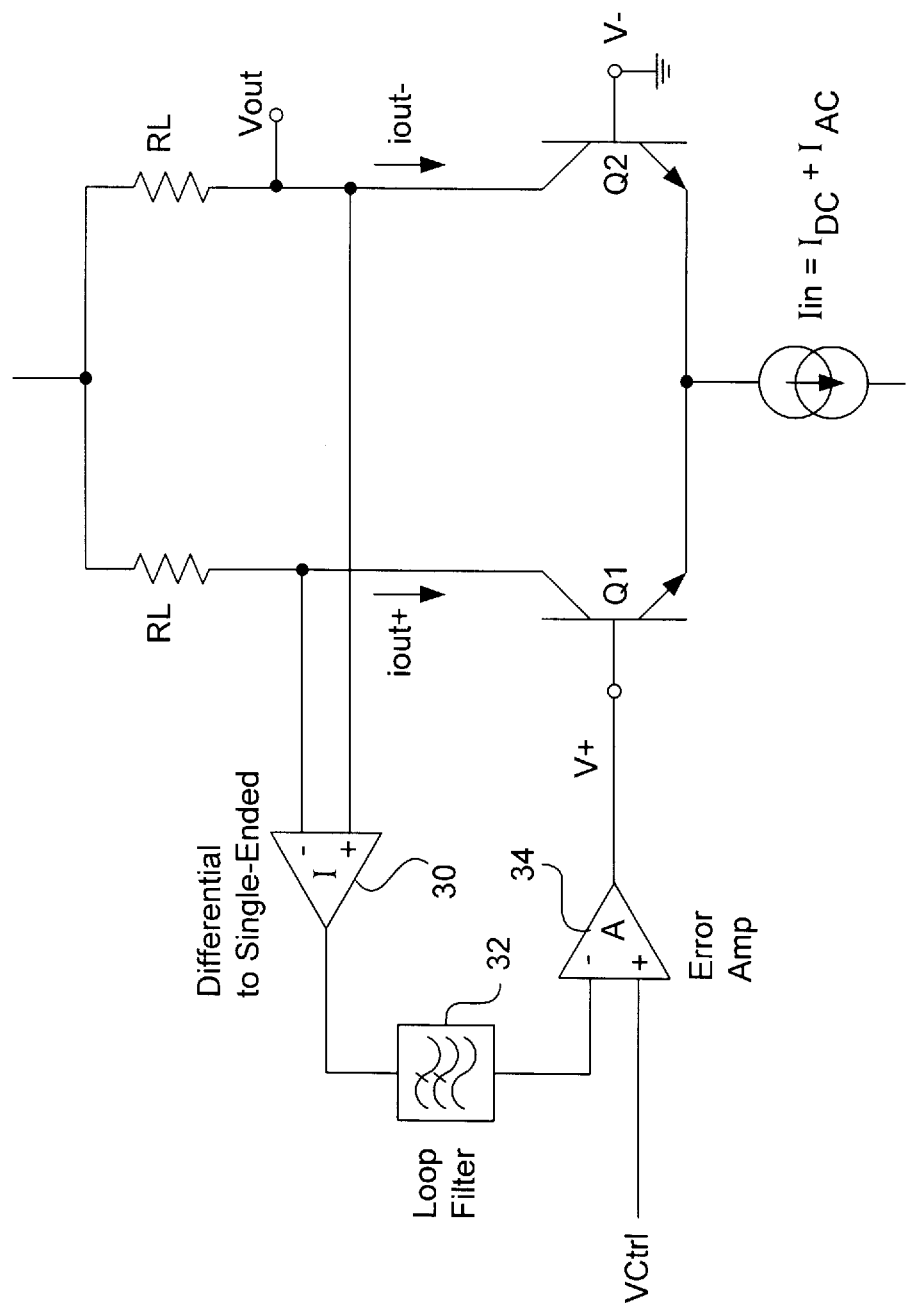
FIG. 4 is a circuit diagram of a second embodiment of the invention which differs from the embodiment of FIG. 3 by having a single-ended output instead of a differential output.

The embodiment shown in FIG. 4 is a variation of the FIG. 3 embodiment. In this embodiment, the output ($V_{out}$) is single-ended instead of differential. In this embodiment the control voltage range is modified. Maximum gain is at $V_{ctrl}=V_{max}$ and minimum gain is at $V_{ctrl}=-V_{max}$. This configuration is particularly useful in avoiding a 180 degree phase shift around 0 V control.

Figure 5:
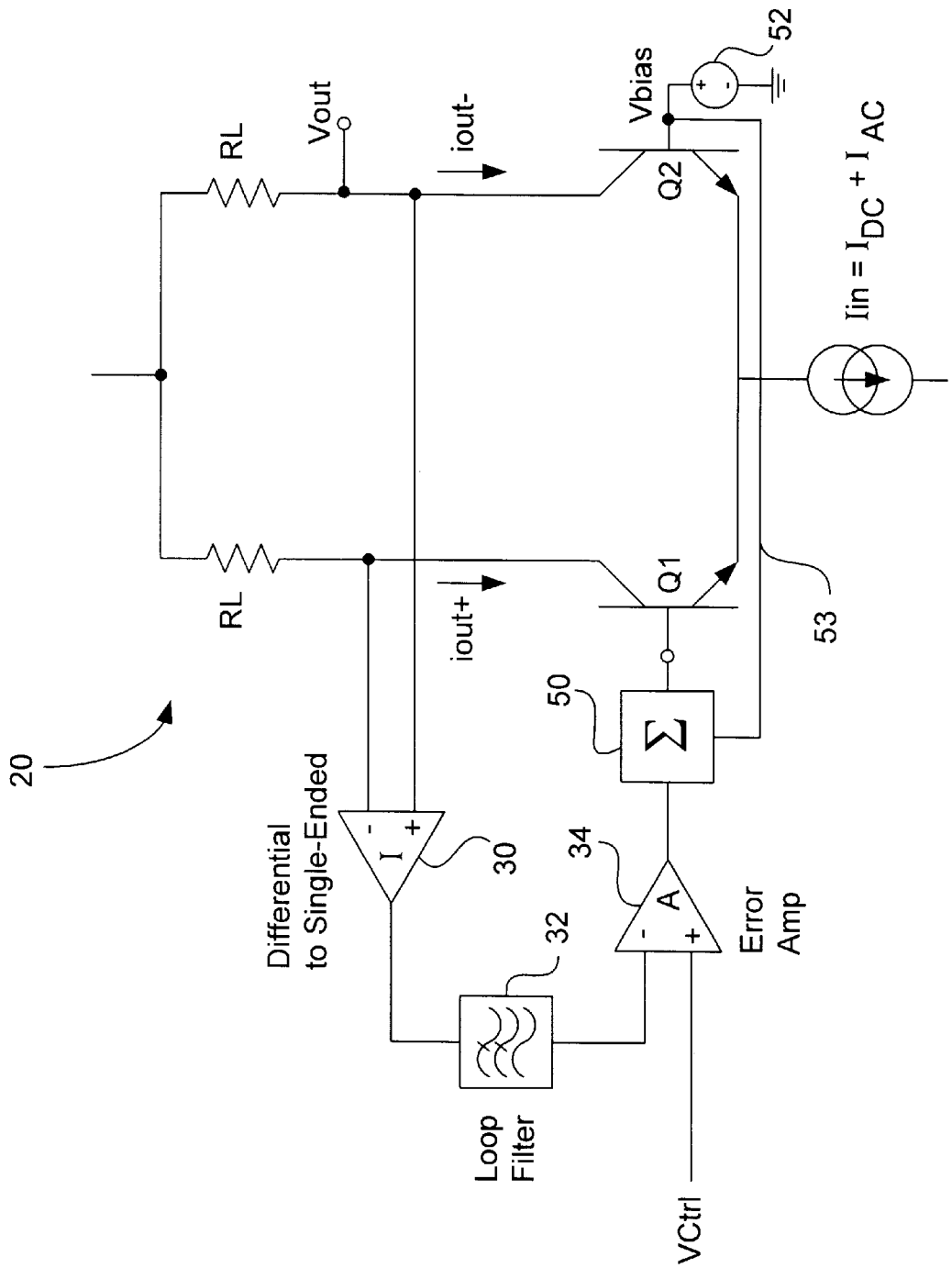
FIGS. 5 and 6 are circuit diagrams of modifications to the circuit of FIG. 4.

FIG. 5 illustrates an enhancement of the arrangement of FIG. 4. In this embodiment the unmodulated base voltage of transistor Q2 is used as a reference for the control voltage. It is fed as one input of summation circuit 50 via lead 53, the other input of summation circuit 50 being the output of error amplifier 34. This is useful in a practical circuit since in the general case, the unmodulated base of Q2 is not at 0 V DC. In FIG. 5 the base of Q2 is shown connected to a bias source 52.

Figure 6:
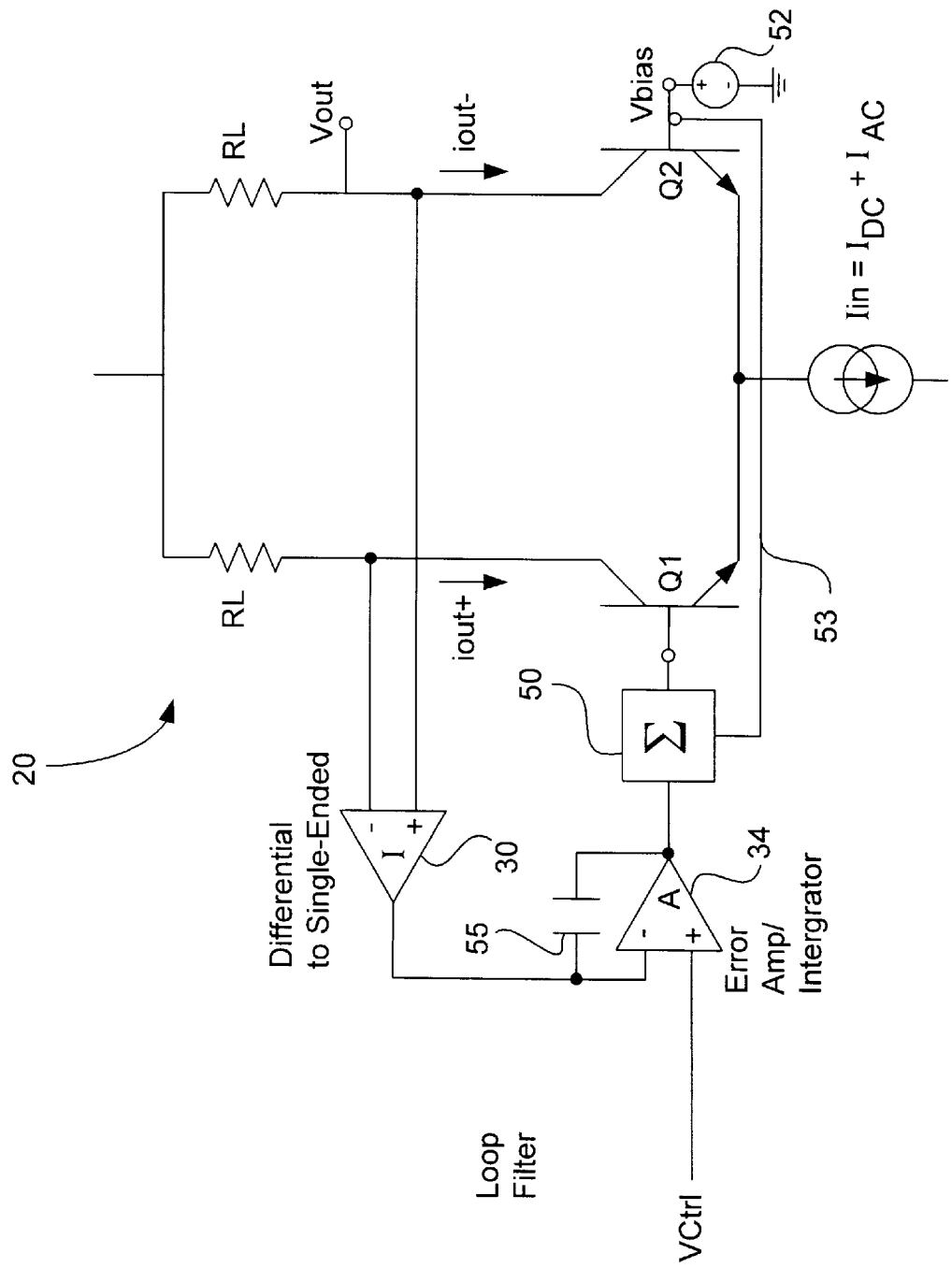
Figure 8:
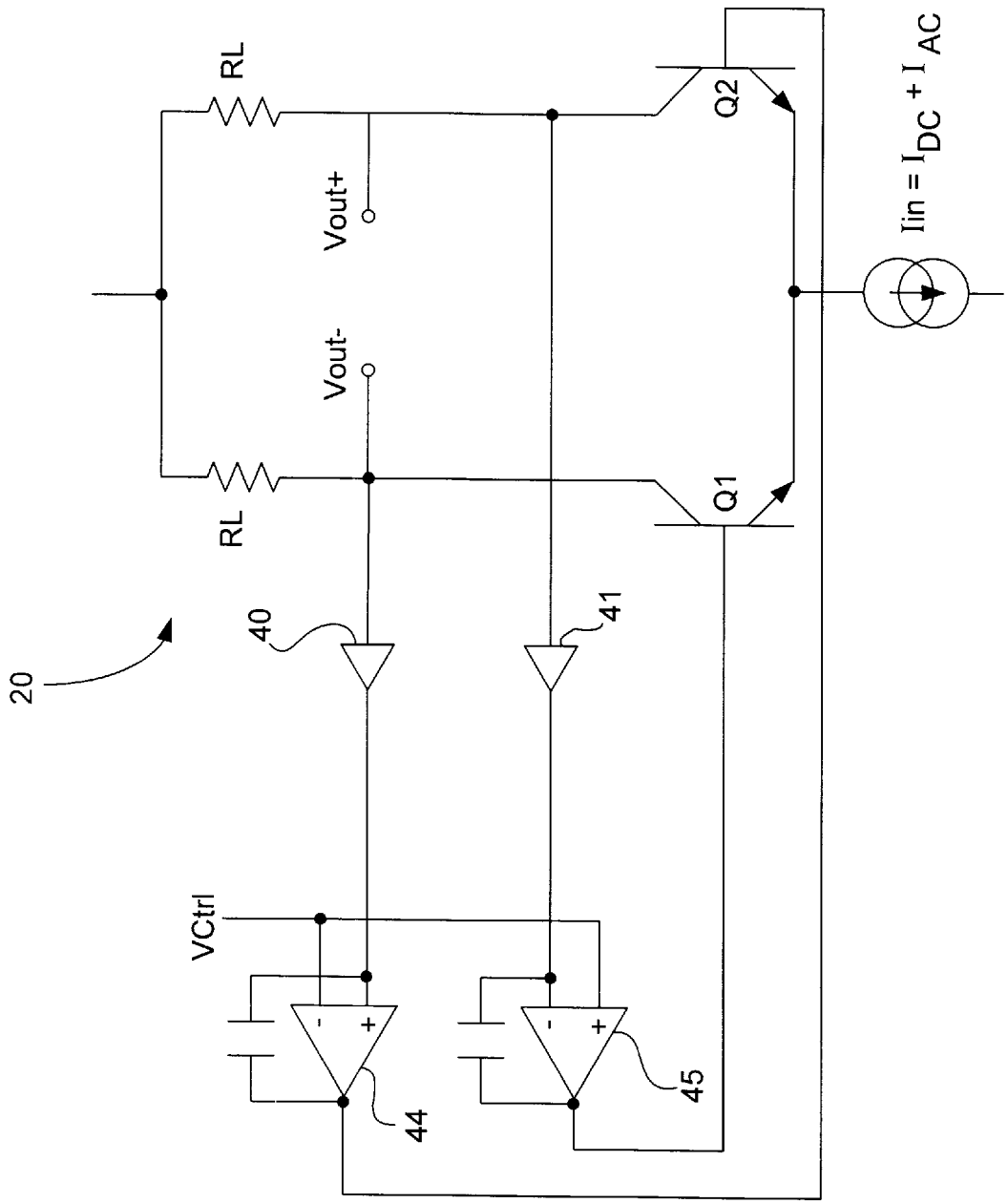
FIG. 8 is a modified circuit diagram of the circuit of FIG. 7.

The circuit of FIG. 5 can be simplified by integrating the low-pass filter and the error amplifier using an active integrator circuit comprising error amp 34 and capacitor 55 as shown in FIG. 6. This principle can also be applied to the circuit of FIG. 7, as shown in FIG. 8.

What I claim as my invention is:

1. A linear gain-controlled amplifier powered by a current supply having AC and DC components, comprising:

a differential transistor pair comprising a first transistor and a second transistor, each transistor having an emitter, a collector and a base, said collectors being coupled in series with respective first and second load resistors to a first terminal of said current supply, said emitters being coupled together and to a second terminal of said current supply;

first and second amplifiers having corresponding first and second inputs coupled to the collectors of the first and second transistors respectively and having corresponding first and second amplified output terminals;

first and second low-pass filters having input terminals coupled to the first and second output terminals respectively and having corresponding first and second DC output terminals;

a first error amplifier having first and second input terminals coupled to the first DC output terminal and a control signal respectively and having an error output terminal coupled to the base of said second transistor; and a second error amplifier having first and second input terminals coupled to the second DC output terminal and the control signal respectively and having an error output terminal coupled to the base of said first transistor.

2. An amplifier as claimed in claim 1, wherein differential output terminals are coupled to the collectors of said first and second transistors.

3. An amplifier as claimed in claim 1, wherein a single-ended output is taken from the collector of said second transistor.

4. A linear gain-controlled amplifier powered by a current supply having AC and DC components, comprising:

a differential transistor pair comprising a first transistor and a second transistor, each transistor having an emitter, a collector and a base, said collectors being coupled in series with respective first and second load resistors to a first terminal of said current supply, said emitters being coupled together and to a second terminal of said current supply;

first and second amplifiers having corresponding first and second inputs coupled to the collectors of the first and second transistors respectively and having corresponding first and second amplified output terminals;

a first active integrator circuit having first and second input terminals coupled to the first amplified output terminal and a control signal respectively and having an error output terminal coupled to the base of said second transistor; and a second active integrator circuit having first and second input terminals coupled to the second amplified output terminal and the control signal respectively and having an error output terminal coupled to the base of said second transistor.

5. An amplifier as claimed in claim 4, wherein differential output terminals are coupled to the collectors of said first and second transistors.

6. An amplifier as claimed in claim 4, wherein a single-ended output is taken from the collector of said second transistor.

7. An amplifier as claimed in claim 4, wherein each of the first and second active integrator circuits comprises an amplifier having the first and second input terminals and the output terminal, and a capacitor coupled between the first input terminal and the output terminal.

8. A linear gain-controlled amplifier powered by a current supply having AC and DC components, comprising:

a differential transistor pair comprising a first transistor and a second transistor, each transistor having an emitter, a collector and a base, said collectors being coupled in series with respective first and second load resistors to a first terminal of said current supply, said emitters being coupled together and to a second terminal of said current supply;

first and second means connected to said first and second transistors respectively for producing respective first and second voltages;

third and fourth means for comparing said respective first and second voltages with a control signal to produce respective first and second error signals, the first and second error signals being supplied to respective first and second gain control terminals of said second and first transistors respectively.

9. An amplifier as claimed in claim 8, wherein said first and second gain control terminals respectively comprise a connection to the base of said second transistor and a connection to the base of said first transistor.

10. An amplifier as claimed in claim 8, wherein differential output terminals are coupled to the collectors of said first and second transistors.

11. An amplifier as claimed in claim 8, wherein a single-ended output is taken from the collector of said second transistor.

12. An amplifier as claimed in claim 9, wherein differential output terminals are coupled to the collectors of said first and second transistors.

13. An amplifier as claimed in claim 9, wherein a single-ended output is taken from the collector of said second transistor.

14. An amplifier as claimed in claim 8, wherein said first and second means includes respective first and second amplifiers and respective first and second low-pass filters, the first and second amplifiers having inputs connected to the first and second transistors respectively and outputs connected to the first and second low-pass filters respectively, the low-pass filters having respective DC output terminals.

15. An amplifier as claimed in claim 14, wherein each of said third and fourth means comprises an error amplifier having first and second input terminals connected to a respective one of the DC output terminals and the control signal respectively and having an error output terminal.

* * * * *